United States Patent
Tsutsumi et al.

(10) Patent No.: US 11,001,704 B2
(45) Date of Patent: May 11, 2021

(54) HEAT-CURABLE RESIN COMPOSITION FOR SEMICONDUCTOR ENCAPSULATION AND SEMICONDUCTOR DEVICE

(71) Applicant: Shin-Etsu Chemical Co., Ltd., Tokyo (JP)

(72) Inventors: Yoshihiro Tsutsumi, Annaka (JP); Naoyuki Kushihara, Annaka (JP); Yuki Kudo, Annaka (JP); Norifumi Kawamura, Annaka (JP); Yoshihira Hamamoto, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 59 days.

(21) Appl. No.: 16/523,345

(22) Filed: Jul. 26, 2019

(65) Prior Publication Data
US 2020/0048455 A1  Feb. 13, 2020

(30) Foreign Application Priority Data
Aug. 10, 2018 (JP) .............................. JP2018-151009

(51) Int. Cl.
| | | |
|---|---|---|
| C08L 63/00 | (2006.01) | |
| H01L 23/29 | (2006.01) | |
| C08G 77/26 | (2006.01) | |
| C08K 3/013 | (2018.01) | |
| C08G 59/62 | (2006.01) | |
| C08G 59/50 | (2006.01) | |
| C08L 83/08 | (2006.01) | |

(52) U.S. Cl.
CPC .......... *C08L 63/00* (2013.01); *C08G 59/5046* (2013.01); *C08G 59/621* (2013.01); *C08G 77/26* (2013.01); *C08K 3/013* (2018.01); *C08L 83/08* (2013.01); *H01L 23/296* (2013.01); *C08L 2203/20* (2013.01); *C08L 2203/206* (2013.01)

(58) Field of Classification Search
CPC .................................................... C08G 77/26
See application file for complete search history.

(56) References Cited

U.S. PATENT DOCUMENTS

| | | | | |
|---|---|---|---|---|
| 5,763,540 A * | 6/1998 | Nakata | ..................... | C08L 63/00 257/E23.12 |
| 7,488,539 B2 * | 2/2009 | Kozakai | ................... | C08L 83/00 428/447 |
| 2006/0216520 A1 | 9/2006 | Osada | | |
| 2010/0056730 A1 * | 3/2010 | Yoneda | ................ | C08G 73/106 525/408 |
| 2011/0061915 A1 * | 3/2011 | Sekito | ..................... | G03F 7/037 174/258 |
| 2012/0285721 A1 * | 11/2012 | Gallucci | ................. | C08L 63/00 174/110 N |
| 2014/0353848 A1 * | 12/2014 | Park | ..................... | H01L 25/0657 257/783 |

FOREIGN PATENT DOCUMENTS

| | | | |
|---|---|---|---|
| JP | 7-216054 A | | 8/1995 |
| JP | 2003-138103 A | | 5/2003 |
| JP | 2006-299246 A | | 11/2006 |
| JP | 2008/138124 | * | 6/2008 |
| JP | 2011/256372 | * | 12/2011 |
| JP | 2012-015311 | * | 1/2012 |
| JP | 2018-24747 A | | 2/2018 |

OTHER PUBLICATIONS

Machine translation of JP 2012-015311 (no date).*
JP 2011/256372 abstract (no date).*
JP 2008/138124 abstract (no date).*
CN 101121819 abstract (no date).*

* cited by examiner

Primary Examiner — Marc S Zimmer
(74) Attorney, Agent, or Firm — Birch, Stewart, Kolasch & Birch, LLP

(57) ABSTRACT

Provided are a resin composition superior in moldability, and capable of yielding a cured product exhibiting a low elastic modulus even at a high temperature and no decrease in glass-transition temperature and having a favorable reflow resistance and heat resistance; and a semiconductor device encapsulated by such cured product. The resin composition is a heat-curable resin composition for semiconductor encapsulation, and contains:

(A) an epoxy resin being solid at 25° C.;
(B) an organopolysiloxane having, in one molecule, at least one cyclic imide group and at least one siloxane bond;
(C) an inorganic filler; and
(D) an anionic curing accelerator.

12 Claims, No Drawings

HEAT-CURABLE RESIN COMPOSITION FOR SEMICONDUCTOR ENCAPSULATION AND SEMICONDUCTOR DEVICE

BACKGROUND OF THE INVENTION

Field of the Invention

The present invention relates to a heat-curable resin composition for semiconductor encapsulation; and a semiconductor device using the same.

Background Art

As an electronic part used in an electronic device, there is known a semiconductor package obtained by encapsulating a semiconductor element with a resin. Conventionally, such semiconductor package is usually manufactured via transfer molding of a tablet-shaped epoxy resin composition. Further, in recent years, as electronic devices have become smaller and lighter, electronic parts are now required to be mounted on wiring substrates in a highly dense manner, and even semiconductor packages are thus becoming smaller, thinner and lighter.

With these developments, the requirements for a semiconductor package material have become stricter than before. Especially, in the case of a semiconductor device employing surface mounting, as a result of exposing the semiconductor device to a high temperature at the time of performing solder reflow, peeling may occur in an interface between a semiconductor element(s) or a lead frame and a cured product of an epoxy resin composition as an encapsulation resin, and cracks may also occur in the semiconductor device, which may lead to failures significantly impairing the reliability of the semiconductor device.

As for these problems, there have been considered a method for reducing a stress occurring, at the time of performing reflow, in the interface between the semiconductor element(s) or lead frame and the cured product of the epoxy resin composition, by lowering the elasticity of the encapsulation resin; and a method for restricting the peeling in the interface by reducing the amount of water discharged as a result of lowering the water absorption rate of the encapsulation resin. Disclosed in JP-A-Hei-7-216054 is a resin composition comprising an epoxy resin containing a biphenyl-type epoxy resin; and a phenolic resin as a curing agent. However, such a kind of material often has a low crosslinking density, cannot easily exhibit a high glass-transition temperature (Tg), and may be inferior in a heat resistance such as a long-term heat resistance.

Meanwhile, an epoxy resin composition, particularly an epoxy resin composition comprising a non-biphenyl type epoxy resin and a phenolic curing agent can be turned into a cured product with a high Tg by increasing the crosslinking density of the composition. However, an excessively high crosslinking density tends to, in general, turn the cured product into a rigid structural body with a higher elastic modulus, and may lead to a higher water absorption rate as many hydroxyl groups will be formed.

In this way, epoxy resin compositions have a difficulty in achieving multiple properties at the same time. In order to solve these problems, there has been considered a combination of an epoxy resin and a maleimide compound. In JP-A-2003-138103 and JP-A-2006-299246, a high Tg and a high moisture resistance were achieved with a combination of an epoxy resin and a rigid maleimide compound. However, high elastic moduluses were observed at high temperatures, and a poor reflow resistance was observed as well. Meanwhile, in JP-A-2018-24747, although a high reflow resistance was achieved with a combination of an epoxy resin and a bismaleimide compound having an aliphatic hydrocarbon group(s) on its main chain, the decomposition of the aliphatic hydrocarbon groups on the main chain was significant during a long-term test. In addition, an epoxy resin and a maleimide compound can be easily separated from each other, though depending on the kind of the epoxy resin. That is, the combination disclosed in JP-A-2018-24747 can only be used in a narrow scope of application, and further improvements are desired.

SUMMARY OF THE INVENTION

Thus, it is an object of the present invention to provide a resin composition superior in moldability, and capable of yielding a cured product exhibiting a low elastic modulus even at a high temperature and no decrease in glass-transition temperature and having a favorable reflow resistance and heat resistance; and a semiconductor device encapsulated by such cured product.

The inventors of the present invention conducted a series of studies to solve the aforementioned problems, and completed the invention as follows. Specifically, the inventors found that the following heat-curable resin composition was capable of achieving the abovementioned objectives.

More specifically, the present invention is to provide the following heat-curable resin composition for semiconductor encapsulation; a cured product thereof; and a semiconductor device encapsulated by such cured product.

[1]

A heat-curable resin composition for semiconductor encapsulation, containing:

(A) an epoxy resin being solid at 25° C.;

(B) an organopolysiloxane having, in one molecule, at least one cyclic imide group and at least one siloxane bond;

(C) an inorganic filler; and (D) an anionic curing accelerator.

[2]

The heat-curable resin composition for semiconductor encapsulation according to [1], wherein the component (B) is at least one selected from the following (B-1) and (B-2):

(B-1) a cyclic imide group-containing organopolysiloxane represented by the following average composition formula (1)

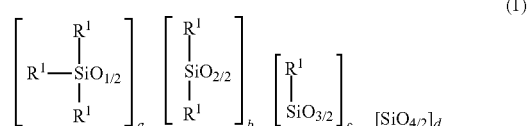

wherein $R^1$ independently represents a substituted or unsubstituted monovalent hydrocarbon group having 1 to 10 carbon atoms, or a group represented by the following general formula (2) or (3); at least one $R^1$ is a group represented by the following general formula (2) or (3); a represents an integer of not smaller than 2; b represents an integer of not smaller than 0; c represents an integer of not smaller than 0; d represents an integer of not smaller than 0; a, b, c and d satisfy $2 \leq a+b+c+d \leq 1{,}000$,

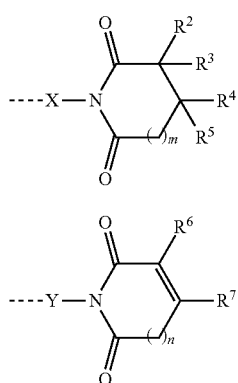

(2)

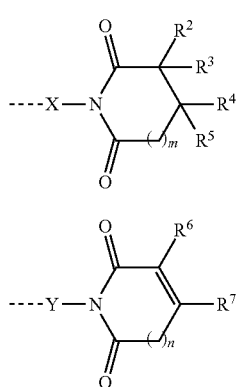

(3)

wherein each of $R^2$ to $R^7$ independently represents a hydrogen atom or a substituted or unsubstituted monovalent hydrocarbon group having 1 to 10 carbon atoms; $R^3$ and $R^4$ may bond together to form a ring; $R^6$ and $R^7$ may bond together to form a ring; each of m and n represents an integer of 0 to 3; each of X and Y represents a substituted or unsubstituted divalent hydrocarbon group that has 1 to 10 carbon atoms, and may have a hetero atom(s); broken lines represent connections to silicon atoms in the formula (1);

(B-2) a cyclic imide group-containing organopolysiloxane represented by the following average composition formula (1')

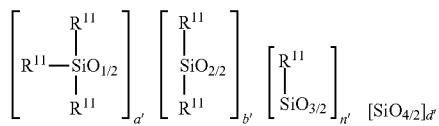

(1')

wherein $R^{11}$ independently represents a substituted or unsubstituted monovalent hydrocarbon group having 1 to 10 carbon atoms, or a group represented by the following general formula (2), (3) or (4); at least one $R^{11}$ is a group represented by the following general formula (2), (3) or (4); two $R^{11}$s may bond together to form the structure represented by the following general formula (4); a' represents an integer of not smaller than 2; b' represents an integer of not smaller than 0; c' represents an integer of not smaller than 0; d' represents an integer of not smaller than 0; a', b', c' and d' satisfy $2 \leq a'+b'+c'+d' \leq 1{,}000$,

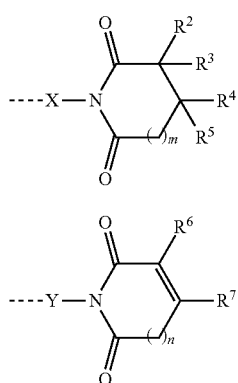

(2)

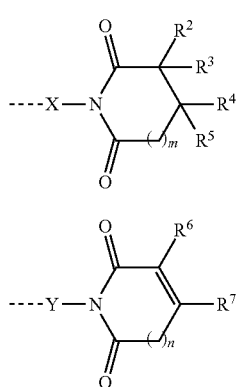

(3)

wherein each of $R^2$ to $R^7$ independently represents a hydrogen atom or a substituted or unsubstituted monovalent hydrocarbon group having 1 to 10 carbon atoms; $R^3$ and $R^4$ may bond together to form a ring; $R^6$ and $R^7$ may bond together to form a ring; each of m and n represents an integer of 0 to 3; each of X and Y represents a substituted or unsubstituted divalent hydrocarbon group that has 1 to 10 carbon atoms, and may have a hetero atom(s); broken lines represent connections to the silicon atoms in the formula (1'),

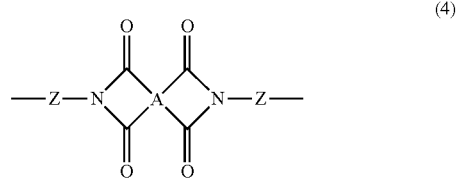

(4)

wherein A represents a tetravalent organic group having an aromatic or aliphatic ring; Z represents a substituted or unsubstituted divalent hydrocarbon group that has 1 to 10 carbon atoms, and may have a hetero group(s).

[3]

The heat-curable resin composition for semiconductor encapsulation according to [2], wherein A in the general formula (4) has any one of the following structures

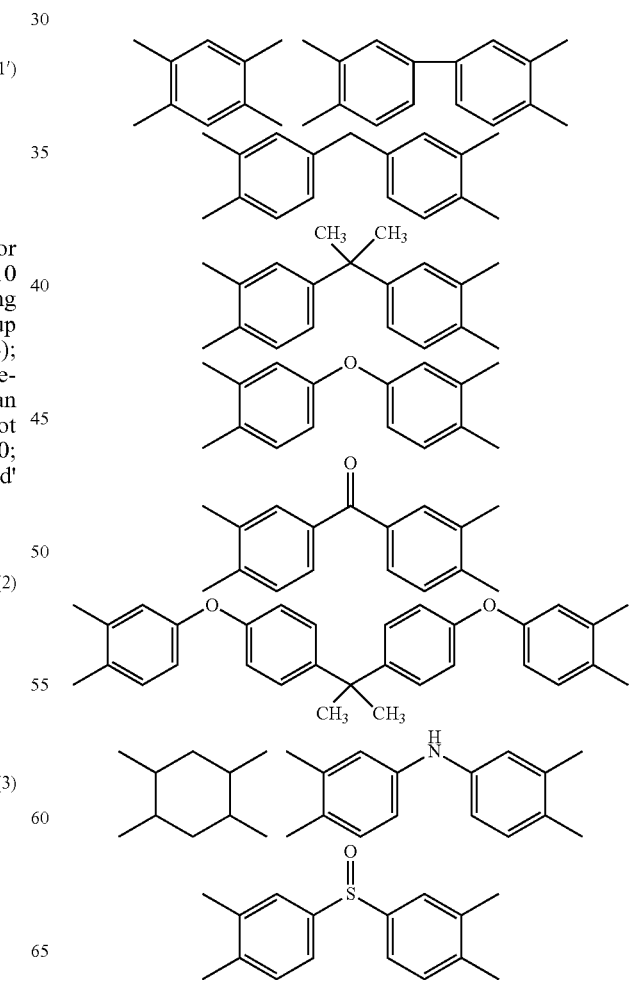

-continued

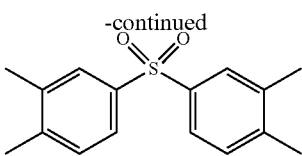

wherein bonds in the above structural formulae that are yet unbonded to substituent groups are to be bonded to carbonyl carbons forming cyclic imide structures in the general formula (4).

[4]

The heat-curable resin composition for semiconductor encapsulation according to [2] or [3], wherein at least one of $R^1$s and/or $R^{11}$s is an organic group having a maleimide structure represented by the following formula (3')

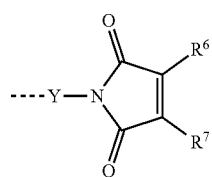

(3')

wherein each of $R^6$ and $R^7$ represents a hydrogen atom or a substituted or unsubstituted monovalent hydrocarbon group having 1 to 10 carbon atoms; $R^6$ and $R^7$ may bond together to form a ring; Y represents a substituted or unsubstituted divalent hydrocarbon group that has 1 to 10 carbon atoms, and may have a hetero atom(s); a broken line represents a connection to the silicon atoms in the formula (1) or (1').

[5]

The heat-curable resin composition for semiconductor encapsulation according to any one of [1] to [4], further comprising a curing agent as a component (E).

[6]

The heat-curable resin composition for semiconductor encapsulation according to [5], wherein the curing agent as the component (E) is a phenol curing agent and/or a benzoxazine curing agent.

[7]

A semiconductor device encapsulated by a cured product of the heat-curable resin composition for semiconductor encapsulation according to any one of [1] to [6].

The heat-curable resin composition of the present invention is superior in moldability, and is capable of yielding a cured product exhibiting a low elastic modulus even at a high temperature and no decrease in glass-transition temperature and having a favorable reflow resistance and heat resistance. That is, the heat-curable resin composition of the invention is useful for semiconductor encapsulation.

DETAILED DESCRIPTION OF THE INVENTION

The present invention is described in greater detail hereunder.

(A) Epoxy Resin

An epoxy resin as a component (A) used in the present invention has at least two epoxy groups in one molecule, and is solid at 25° C. in terms of moldability and handling property. Further, it is preferred that such epoxy resin be a solid having a melting point of 40 to 150° C. or a softening point of 50 to 160° C.

Specific examples of the epoxy resin as the component (A) include a bisphenol A-type epoxy resin; a bisphenol F-type epoxy resin; biphenyl type epoxy resins such as 3,3', 5,5'-tetramethyl-4,4'-biphenol type epoxy resin and 4,4'-biphenol type epoxy resin; a phenol novolac-type epoxy resin; a cresol novolac-type epoxy resin; a bisphenol A novolac-type epoxy resin; a naphthalenediol-type epoxy resin; a trisphenylol methane-type epoxy resin; a tetrakisphenylol ethane-type epoxy resin; a phenol biphenyl-type epoxy resin; an epoxy resin prepared by hydrogenating the aromatic rings in a dicyclopentadiene-type epoxy resin; an epoxy resin prepared by hydrogenating the aromatic rings in a phenol dicyclopentadiene novolac-type epoxy resin; a triazine derivative epoxy resin; and an alicyclic epoxy resin.

Any one of these epoxy resins may be used singularly, or two or more of them may be used in combination.

It is preferred that the component (A) be contained in the composition of the invention, by an amount of 8 to 50% by mass, more preferably 9 to 45% by mass, and even more preferably 10 to 40% by mass.

(B) Cyclic Imide Group-Containing Organopolysiloxane

A component (B) used in the present invention is a cyclic imide group-containing organopolysiloxane. Particularly, the component (B) is an organopolysiloxane having, in one molecule, at least one cyclic imide group and at least one siloxane bond (Si—O bond).

It is preferred that the component (B) be at least one selected from the following (B-1) and (B-2).

(B-1) Cyclic Imide Group-Containing Organopolysiloxane Represented by the Following Average Composition Formula (1)

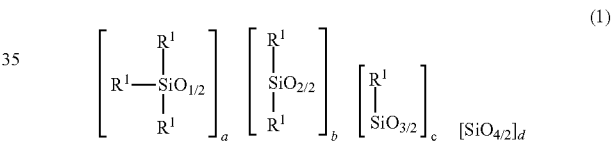

(1)

In the above formula, $R^1$ independently represents a substituted or unsubstituted monovalent hydrocarbon group having 1 to 10 carbon atoms; or a group represented by the following general formula (2) or (3). At least one $R^1$ is a group represented by the following general formula (2) or (3). a represents an integer of not smaller than 2, b represents an integer of not smaller than 0, c represents an integer of not smaller than 0, and d represents an integer of not smaller than 0, provided that a, b, c and d satisfy $2 \le a+b+c+d \le 1,000$.

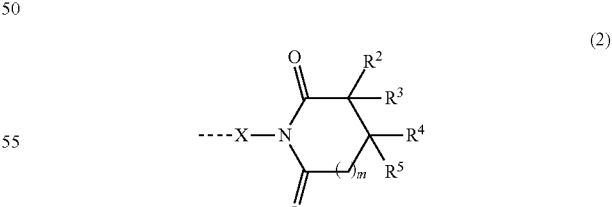

(2)

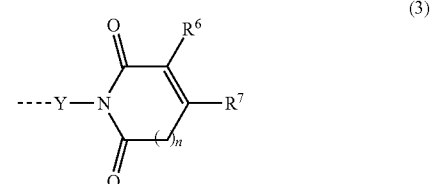

(3)

In the above formulae, each of $R^2$ to $R^7$ independently represents a hydrogen atom or a substituted or unsubstituted monovalent hydrocarbon group having 1 to 10 carbon atoms. $R^3$ and $R^4$ may bond together to form a ring, and $R^6$ and $R^7$ may bond together to form a ring. Each of m and n represents an integer of 0 to 3. Each of X and Y represents a substituted or unsubstituted divalent hydrocarbon group that has 1 to 10 carbon atoms, and may have a hetero atom(s). Broken lines represent connections to the silicon atoms in the formula (1).

(B-2) Cyclic Imide Group-Containing Organopolysiloxane Represented by the Following Average Composition Formula (1')

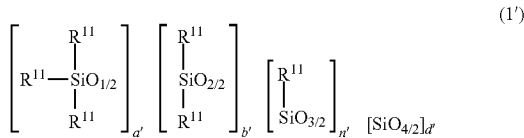

In the above formula, $R^{11}$ independently represents a substituted or unsubstituted monovalent hydrocarbon group having 1 to 10 carbon atoms; or a group represented by the following general formula (2), (3) or (4). At least one $R^{11}$ is a group represented by the following general formula (2), (3) or (4). Two $R^{11}$s may bond together to form the structure represented by the following general formula (4). a' represents an integer of not smaller than 2, b' represents an integer of not smaller than 0, c' represents an integer of not smaller than 0, and d' represents an integer of not smaller than 0, provided that a', b', c' and d' satisfy $2 \leq a'+b'+c'+d' \leq 1{,}000$.

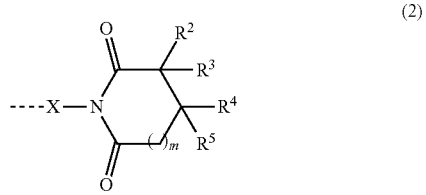

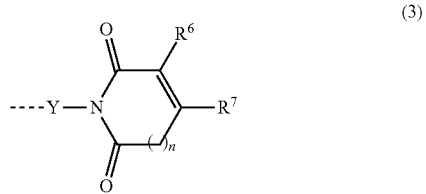

In the above formulae, each of $R^2$ to $R^7$ independently represents a hydrogen atom or a substituted or unsubstituted monovalent hydrocarbon group having 1 to 10 carbon atoms. $R^3$ and $R^4$ may bond together to form a ring, and $R^6$ and $R^7$ may bond together to form a ring. Each of m and n represents an integer of 0 to 3. Each of X and Y represents a substituted or unsubstituted divalent hydrocarbon group that has 1 to 10 carbon atoms, and may have a hetero atom(s). Broken lines represent connections to the silicon atoms in the formula (1').

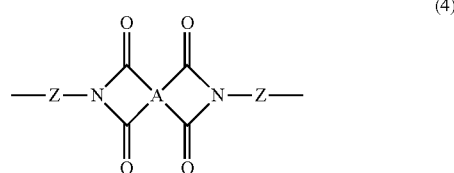

In the general formula (4), A represents a tetravalent organic group having an aromatic or aliphatic ring. Z represents a substituted or unsubstituted divalent hydrocarbon group that has 1 to 10 carbon atoms, and may have a hetero group(s).

The cyclic imide group-containing organopolysiloxane as the component (B) not only can form a polymer with a high heat resistance by the reaction of the cyclic imide groups, but also tends to lead to a low elasticity as the main backbone thereof is that of polysiloxane, and can further impart a high heat resistance as well due to the strengths of the bonding forces of the siloxane bonds (Si—O bonds). In addition, since the component (B) has a polysiloxane backbone, the composition of the present invention shall exhibit not only a low water absorption rate, but also a high moisture discharge rate, which will then result in a high reflow resistance.

In the formula (1) representing the component (B-1), IV independently represents a substituted or unsubstituted monovalent hydrocarbon group having 1 to 10 carbon atoms; or the group represented by the above general formula (2) or (3). At least one IV is a group represented by the general formula (2) or (3). Examples of the substituted or unsubstituted monovalent hydrocarbon group having 1 to 10 carbon atoms include alkyl groups such as a methyl group, an ethyl group, a propyl group and a butyl group; cycloalkyl groups such as a cyclohexyl group; and aryl groups such as a phenyl group. Moreover, a part of or all the hydrogen atoms that are bonded to carbon atoms in any of these groups may be substituted with halogen atoms or other groups; examples of substituent groups include a trifluoromethyl group and 3,3,3-trifluoropropyl group. Here, a substituted or unsubstituted monovalent hydrocarbon group having 1 to 10 carbon atoms is preferable; a saturated aliphatic hydrocarbon group having 1 to 6 carbon atoms or an aromatic hydrocarbon group having 6 to 10 carbon atoms is more preferable; a methyl group and a phenyl group are even more preferable.

At least 1, preferably 2 to 200, more preferably 2 to 150 of the $R^1$s are the groups represented by the general formula (2) or (3).

In the above formulae (2) and (3), each of $R^2$ to $R^7$ independently represents a hydrogen atom or a substituted or unsubstituted monovalent hydrocarbon group having 1 to 10 carbon atoms. Examples of such monovalent hydrocarbon group include alkyl groups such as a methyl group, an ethyl group, a propyl group and a butyl group; cycloalkyl groups such as a cyclohexyl group; and aryl groups such as a phenyl group. Moreover, a part of or all the hydrogen atoms that are bonded to carbon atoms in any of these groups may be substituted with halogen atoms or other groups; examples of substituent groups include a trifluoromethyl group and 3,3,3-trifluoropropyl group, and preferred are a hydrogen atom and a methyl group. Further, $R^3$ and $R^4$ may bond together to form a ring, and $R^6$ and $R^7$ may bond together to form a ring. Examples of such ring include a cyclopropane ring, a cyclobutane ring, a cyclopentane ring, a cyclohexane ring and a benzene ring, among which a benzene ring is preferred.

Each of m and n represents an integer of 0 to 3, preferably an integer of 0 to 2, more preferably 0 or 1.

Further, in the formula (1) representing the component (B-1), it is more preferred that at least one $R^1$ be a group represented by the following formula (3') (formula (3') being established when n=0 in the above formula (3)). In the general formula (3'), $R^6$, $R^7$ and Y are defined as above.

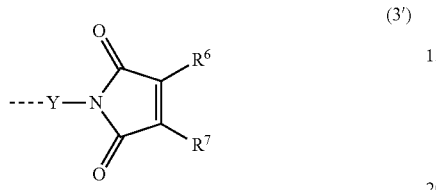

(3')

In the formulae (2), (3) and (3'), each of X and Y represents a substituted or unsubstituted divalent hydrocarbon group having 1 to 10 carbon atoms, and may have a hetero atom(s). Examples of such divalent hydrocarbon group include alkylene groups such as $CH_2$, $C_2H_4$, $C_3H_6$, $C_4H_8$, $C_5H_{10}$ and $C_6H_{12}$, and the divalent hydrocarbon group may also have, for example, an ether group(s) or thioether group(s). Further, there may also be formed a cyclic structure such as that of a phenylene group or a cyclohexylene group; and a part of or all the hydrogen atoms bonded to carbon atoms may be substituted with halogen atoms or other groups.

In the above formula (1), a represents an integer of not smaller than 2, preferably an integer of 2 to 12; b represents an integer of not smaller than 0, preferably an integer of 0 to 998, more preferably an integer of 0 to 100; c represents an integer of not smaller than 0, preferably an integer of 0 to 10; and d represents an integer of not smaller than 0, preferably an integer of 0 to 5. Here, a, b, c and d satisfy 2≤a+b+c+d≤1,000, preferably 2≤a+b+c+d≤100. When a+b+c+d is greater than 1,000, workability may be impaired.

In the formula (1') representing the above component (B-2), $R^{11}$ independently represents a substituted or unsubstituted monovalent hydrocarbon group having 1 to 10 carbon atoms; or a group represented by the general formula (2), (3) or (4). At least one $R^{11}$ is a group represented by the general formula (2), (3) or (4). Two $R^{11}$s may bond together to form a structure represented by the general formula (4). Here, among the groups represented by $R^{11}$, preferable forms of the monovalent hydrocarbon group or the group represented by the general formula (2) or (3) may be those identical to that of $R^1$ in the component (B-1).

Z in the formula (4) represents a substituted or unsubstituted divalent hydrocarbon group that has 1 to 10 carbon atoms, and may have a hetero group(s), the divalent hydrocarbon group being derived from a diamine compound as a raw material for synthesizing the component (B). Examples of the diamine compound include aliphatic diamines such as tetramethylenediamine, 1,4-diaminocyclohexane and 4,4'-diaminodicyclohexylmethane; and aromatic diamines such as phenylenediamine, 4,4'-diaminodiphenylether and 2,2-bis(4-aminophenyl)propane. Two or more of them may be used in combination.

A in the formula (4) represents a tetravalent organic group having an aromatic or aliphatic ring. Here, it is preferred that A have any one of the following structures in terms of ease in synthesizing and availability.

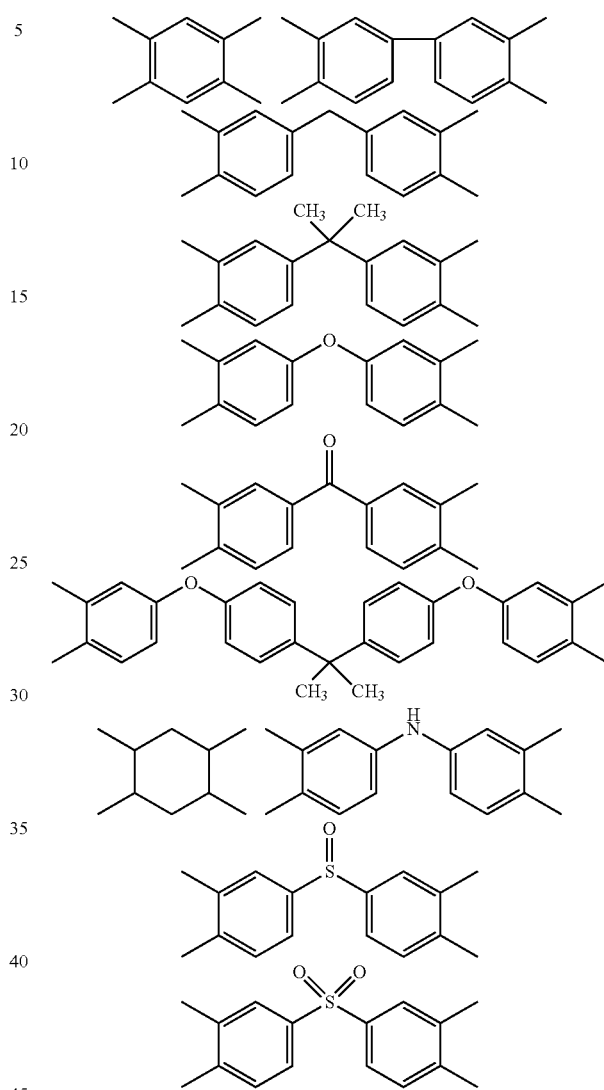

In the above formula (1'), a' represents an integer of not smaller than 2, preferably an integer of 2 to 12; b' represents an integer of not smaller than 0, preferably an integer of 0 to 998, more preferably an integer of 0 to 100; c' represents an integer of not smaller than 0, preferably an integer of 0 to 10; and d' represents an integer of not smaller than 0, preferably an integer of 0 to 5. Here, a', b', c' and d' satisfy 2≤a'+b'+c'+d'≤1,000, preferably 2≤a'+b'+c'+d'≤100. When a'+b'+c'+d' is greater than 1,000, workability may be impaired.

As for the property of the component (B) at room temperature, it may be either solid or liquid. However, it is preferred that the component (B) be solid in terms of a molding method of the composition of the present invention. Here, there may be used one or multiple kinds of the organopolysiloxane as the component (B).

In addition to the cyclic imide group-containing organopolysiloxane as the component (B), a maleimide compound having no siloxane bond may be used together. For example, there may be used the maleimide compounds represented by the following formulae (5) and (7).

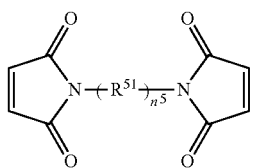

(5)

In the above formula (5), $n^5$ represents a number of 1 to 50. $R^{51}$ represents one or more kinds of divalent groups selected from a linear or branched alkylene group having 1 to 40 carbon atoms; a divalent cyclic hydrocarbon group that has 3 to 20 carbon atoms and may have a hetero atom(s); —O—; —NH—; —S—; and —SO$_2$—.

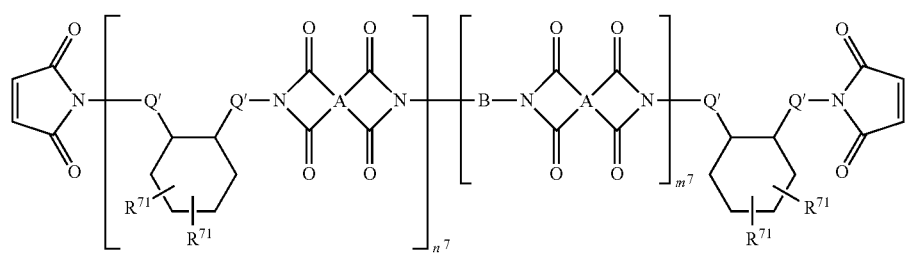

(7)

In the above formula (7), A is defined as above; B represents an alkylene chain having 6 to 18 carbon atoms and a divalent aliphatic ring that may contain a hetero atom. Q' independently represents a linear alkylene group having 6 or more carbon atoms. $R^{71}$ independently represents a linear or branched alkyl group having 6 or more carbon atoms. $n^7$ represents a number of 1 to 10. $m^7$ represents a number of 0 to 10.

As a method for synthesizing the cyclic imide group-containing organopolysiloxane as the component (B), a (poly)amino group-modified organopolysiloxane having the corresponding backbone (e.g. 1,3-di(3-aminopropyl)-1,1,3,3-tetramethyldisiloxane; a reaction mixture of 1,3-di(3-aminopropyl)-1,1,3,3-tetramethyldisiloxane and 4,4'-oxydiphthalic anhydride) and an acid anhydride compound (e.g. maleic anhydride) are at first reacted under the presence of an acid catalyst. After a (poly)amic acid is formed, the acid amide in the (poly)amic acid is then subjected to a dehydration cyclization reaction in a solvent such as toluene.

A ratio between the components (A) and (B) is in a range of (A):(B)=99:1 to 10:90, preferably 95:5 to 50:50, in terms of parts by mass. A poor moldability may often be observed when the amount of the component (A) is small with respect to the amount of the component (B).

(C) Inorganic Filler

An inorganic filler as a component (C) is added to improve the strength of a cured product of the heat-curable resin composition of the present invention. As the inorganic filler as the component (C), there may be used those that are normally added to an epoxy resin composition or a silicone resin composition. For example, there may be used silicas such as a spherical silica, a molten silica and a crystalline silica; alumina; silicon nitride; aluminum nitride; boron nitride; a glass fiber; and a glass particle(s).

While there are no particular restrictions on the average particle size and shape of the inorganic filler as the component (C), it is preferred that the average particle size thereof be 3 to 40 µm. As the component (C), preferred is a spherical silica having an average particle size of 0.5 to 40 µm. Here, an average particle size refers to a value obtained as a mass average value $D_{50}$ (or median diameter) in a particle size distribution measurement that is carried out by a laser diffraction method.

Further, from the perspective of achieving a higher fluidity of the composition obtained, inorganic fillers with particle sizes from multiple ranges may be used in combination. In such case, it is preferred that there be combined spherical silicas with particle sizes belonging to a microscopic range of 0.1 to 3 µm, an intermediate range of 3 to 7 µm, and a coarse range of 10 to 40 µm. In order to achieve an even higher fluidity, it is preferred that there be used a spherical silica with an even larger average particle size.

It is preferred that the inorganic filler as the component (C) be employed in an amount of 300 to 1,000 parts by mass, particularly preferably 400 to 800 parts by mass, per a sum total of 100 parts by mass of, for example, the components (A) and (B) as heat-curable resin components. When such amount is smaller than 300 parts by mass, there exists a concern that a sufficient strength may not be achieved. When such amount is greater than 1,000 parts by mass, unfilling defects due to an increase in viscosity may occur, and a flexibility may be lost, which may then cause failures such as peeling in an element(s). Here, it is preferred that this inorganic filler be contained in an amount of 10 to 90% by mass, particularly preferably 20 to 85% by mass, with respect to the whole composition.

(D) Anionic Curing Accelerator

An anionic curing accelerator as a component (D) is added to the heat-curable resin composition of the present invention. The anionic curing accelerator is to promote the reaction between the epoxy resin as the component (A) and the cyclic imide group-containing organopolysiloxane as the component (B). Further, the anionic curing accelerator also promotes the reaction of a later-described curing agent as a component (E).

In general, a radical reaction initiator is often used to promote the reaction of cyclic imide groups. In the present invention, it is not preferable to use a radical reaction initiator alone as far as the reaction with the epoxy groups is concerned. However, such radical reaction initiator may be used together with an anionic curing accelerator.

There are no particular restrictions on the anionic curing accelerator as the component (D), as long as it is capable of promoting the curing reaction of a general epoxy resin composition. Examples of such anionic curing accelerator include an amine-based compound such as 1,8-diazabicyclo[5,4,0]-7-undecene; an organic phosphorus compound such as triphenylphosphine and tetraphenylphosphonium-tetraborate salt; and an imidazole compound such as 2-methylimidazole. Here, imidazole compounds are preferably used.

Regardless of the kind(s) thereof, any one of these anionic curing accelerators may be used singularly, or two or more of them may be used in combination. Further, as described above, the anionic curing accelerator may also be used together with a radical reaction initiator. Such anionic curing accelerator is added in an amount of 0.1 to 10 parts by mass, preferably 0.2 to 5 parts by mass, per a sum total of 100 parts by mass of the component (A), the component (B) and the later-described component (E).

Other than the abovementioned components, the following optional component(s) may further be added to the composition of the present invention.

(E) Curing Agent

As a curing agent as the component (E), there may be used, for example, a phenol curing agent, an amine curing agent, an acid anhydride curing agent and a benzoxazine curing agent. Here, a phenol curing agent and/or a benzoxazine curing agent are preferred for use in a semiconductor encapsulation material.

There are no particular restrictions on a phenol curing agent, as long as it is a compound having at least two phenolic hydroxyl groups in one molecule. However, in terms of handling property, it is preferred that the phenol curing agent be solid at room temperature (25° C.), and it is more preferred that the phenol curing agent be a solid having a melting point of 40 to 150° C. and a softening point of 50 to 160° C. Specific examples of such phenol curing agent include a phenol novolac resin, a cresol novolac resin, a phenol aralkyl resin, a naphthol aralkyl resin, a terpene-modified phenolic resin and a dicyclopentadiene-modified phenolic resin. Any one of these phenol curing agents may be used singularly, or two or more of them may be used in combination. Particularly, a cresol novolac resin and a dicyclopentadiene-modified phenolic resin are preferred.

The component (E) is added in a way such that an equivalent ratio of the phenolic hydroxyl groups in the component (E) to the epoxy groups in the component (A) will be in a range of 0.5 to 2.0, preferably 0.7 to 1.5. When such equivalent ratio is lower than 0.5 or greater than 2.0, the composition may exhibit an impaired curability and other impaired properties, and the cured product thereof may exhibit an impaired mechanical property and other impaired properties as well.

There are also no particular restrictions on a benzoxazine curing agent. Those represented by the following general formulae (8) and (9) may be used preferably.

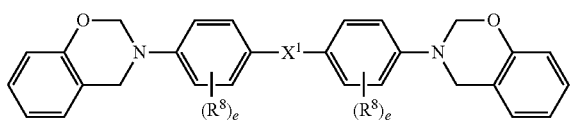

(8)

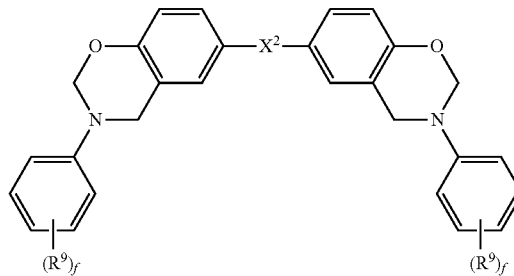

(9)

In the general formulae (8) and (9), each of $X^1$ and $X^2$ is independently selected from the group consisting of an alkylene group having 1 to 10 carbon atoms, —O—, —NH—, —S—, —SO$_2$— and a single bond. Each of $R^8$ and $R^9$ independently represents a hydrogen atom or a hydrocarbon group having 1 to 6 carbon atoms. Each of e and f independently represents an integer of 0 to 4.

If the above phenol curing agent and benzoxazine curing agent are used in combination, a preferable compounding ratio therebetween i.e. a preferable mass ratio therebetween is (phenol curing agent):(benzoxazine curing agent)=90:10 to 20:80.

(F) Mold Release Agent

A mold release agent can be added to the heat-curable resin composition of the invention which is used for semiconductor encapsulation. The mold release agent as a component (F) is added to improve a mold releasability at the time of performing molding. There are no restrictions on such mold release agent, as long as the mold release agent employed is that used in a general heat-curable epoxy resin composition. While examples of the mold release agent include a natural wax (e.g. carnauba wax and rice wax) and a synthetic wax (e.g. acid wax, polyethylene wax and fatty acid ester), carnauba wax is preferred in terms of the mold releasability of the cured product.

It is preferred that the component (F) be added in an amount of 0.05 to 5.0% by mass, particularly preferably 1.0 to 3.0% by mass, with respect to the sum total of the heat-curable resin components. When such amount of the component (F) added is smaller than 0.05% by mass, the cured product of the composition of the invention may not exhibit a sufficient mold releasability. When the amount of the component (F) added is greater than 5.0% by mass, the composition of the invention may bleed out, and the cured product of the composition may exhibit an adhesion failure, for example.

In this specification, the heat-curable resin components refer to the components (A) and (B); if the component (E) is added as an optional component, the component (E) shall also be regarded as a heat-curable resin component.

(G) Coupling Agent

A coupling agent such as a silane coupling agent and a titanate coupling agent can be added to the heat-curable resin composition of the invention which is used for semiconductor encapsulation, for the purpose of, for example, improving a bonding strength between the heat-curable resin components; and the inorganic filler as the component (C), and improving an adhesiveness between such resin components and a metal lead frame or substrate.

Examples of such coupling agent include an epoxy functional alkoxysilane (e.g. 3-glycidoxypropyltrimethoxysilane, 3-glycidoxypropylmethyldiethoxysilane and β-(3,4- epoxycyclohexyl)ethyltrimethoxysilane), a mercapto functional alkoxysilane (e.g. γ-mercaptopropyltrimethoxysilane) and an amine functional alkoxysilane (e.g. γ-aminopropyltrimethoxysilane and N-2-(aminoethyl)-3-aminopropyltrimethoxysilane).

There are no particular restrictions on the amount of the coupling agent added and a surface treatment method thereof. Such amount and surface treatment method may be derived from a common procedure(s).

Further, the inorganic filler may be treated with the coupling agent in advance; or the composition may be produced while performing surface treatment by adding the coupling agent at the time of kneading the heat-curable resin components together with the inorganic filler.

It is preferred that the component (G) be contained in an amount of 0.1 to 8.0% by mass, particularly preferably 0.5 to 6.0% by mass, per the sum total of the heat-curable resin components. When such amount of the component (G) is smaller than 0.1% by mass, an insufficient adhesion effect to a base material may be observed. When the amount of the component (G) is greater than 8.0% by mass, a viscosity may extremely decrease such that voids may occur.

(H) Flame Retardant

A flame retardant can be added to the heat-curable resin composition of the invention which is used for semiconductor encapsulation, for the purpose of improving a flame retardancy. There are no particular restrictions on such flame retardant, and any known flame retardant may be used. For example, there may be used a phosphazene compound, a silicone compound, a zinc molybdate-supported talc, a zinc molybdate-supported zinc oxide, an aluminum hydroxide, a magnesium hydroxide, a molybdenum oxide and an antimony trioxide. Any one of these flame retardants may be used singularly, or two or more kinds of them may be used in combination. The flame retardant(s) is added in an amount of 2 to 20 parts by mass, preferably 3 to 10 parts by mass, per the sum total of 100 parts by mass of the heat-curable resin components.

Other Additives

If necessary, various types of additives may further be added to the heat-curable resin composition of the invention which is used for semiconductor encapsulation. On the premise that the effects of the present invention shall not be impaired, the additive(s) added may, for example, be an organopolysiloxane, a silicone oil, a thermoplastic resin, a thermoplastic elastomer, an organic synthetic rubber, a silicone powder, a light stabilizer, a pigment and/or a dye, for the purpose of improving resin properties; or, for example, be an ion trapping agent for the purpose of improving electrical properties. A fluorine-containing material such as a fluorine-coated filler may, for example, be further added for the purpose of improving a dielectric property.

Production Method

There are no particular restrictions on a method for producing the composition of the present invention. For example, the components (A) to (D) and other components, if necessary, are to be blended together at given compounding ratios. Next, a mixer or the like is used to thoroughly and uniformly mix these components, followed by melting and mixing them with, for example, a heat roller, a kneader or an extruder. A product thus obtained is then cooled to be solidified, and is later crushed into pieces of an appropriate size. The resin composition thus obtained can be used as a molding material.

As the most general method for molding the resin composition, there can be listed a transfer molding method and a compression molding method. In a transfer molding method, a transfer molding machine is used to perform molding under a molding pressure of 5 to 20 N/mm$^2$ and at a molding temperature of 120 to 190° C. for a molding period of 30 to 500 sec, preferably at a molding temperature of 150 to 185° C. for a molding period of 30 to 180 sec. Further, in a compression molding method, a compression molding machine is used to perform molding at a molding temperature of 120 to 190° C. for a molding period of 30 to 600 sec, preferably at a molding temperature of 130 to 160° C. for a molding period of 120 to 600 sec. Moreover, in each molding method, post curing may further be performed at 150 to 225° C. for 0.5 to 20 hours.

If produced by the above method, the cured product of the heat-curable resin composition of the invention which is used for semiconductor encapsulation shall exhibit a low elastic modulus and no decrease in glass-transition temperature; and a favorable reflow resistance and heat resistance. The heat-curable resin composition of the invention which is used for semiconductor encapsulation, is suitable for encapsulating, for example, semiconductors and various types of in-car modules.

WORKING EXAMPLE

The present invention is described in detail hereunder with reference to working and comparative examples. However, the invention is not limited to the working examples below.

(A) Epoxy Resin (A-1) Trisphenylol methane-type epoxy resin (EPPN-501H by Nippon Kayaku Co., Ltd.; epoxy equivalent 165) (softening point 54° C.)

(A-2) Dicyclopentadiene-type epoxy resin (HP-7200 by DIC Corporation; epoxy equivalent 259) (softening point 61° C.)

(B) Cyclic Imide Group-Containing Organopolysiloxane (B-1) Maleimide group-containing organopolysiloxane (B-1-1) Maleimide group-containing organopolysiloxane-1 represented by the following formula

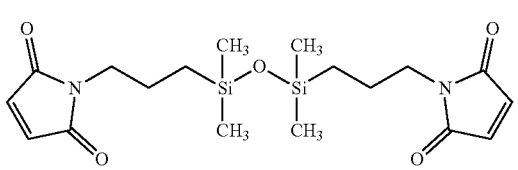 [SMILES: C[Si](C)(CCCN1C(=O)C=CC1=O)O[Si](C)(C)CCCN1C(=O)C=CC1=O]

(B-1-2) Maleimide group-containing organopolysiloxane-2 represented by the following formula

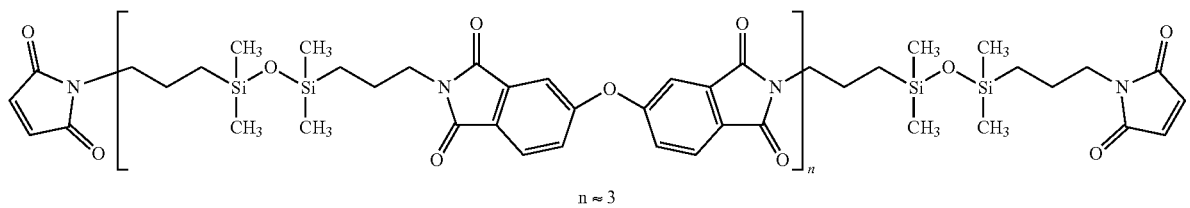

n ≈ 3

(B-2) Other maleimide compound(s) (for use in comparative examples)
(B-2-1) Maleimide compound represented by the following formula (BMI-3000 by Designer Molecules Inc.)

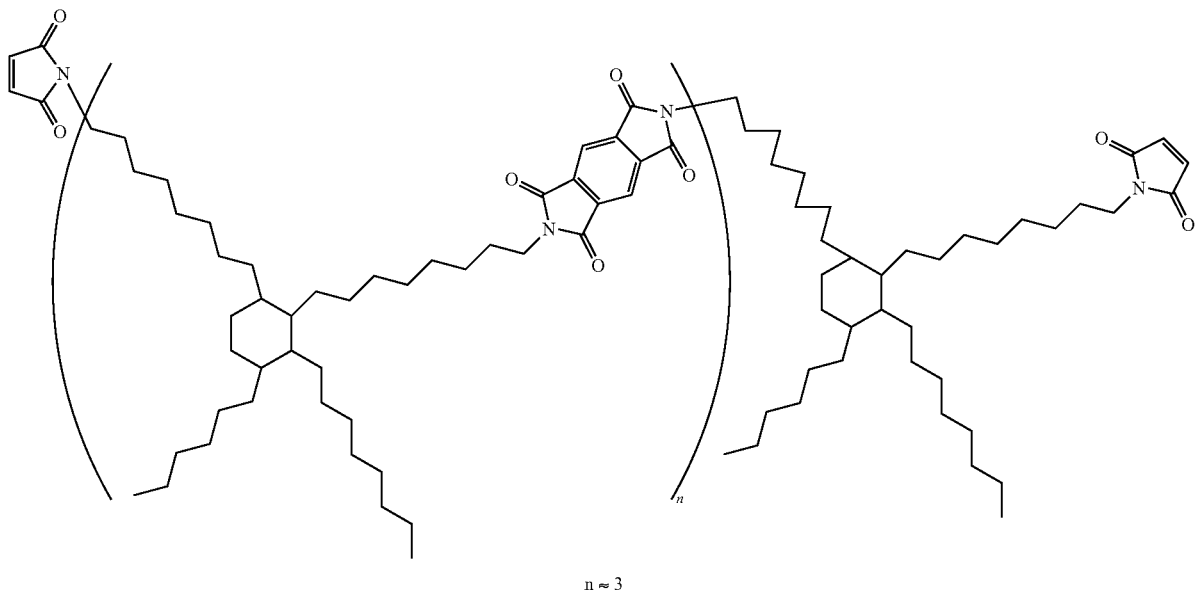

n ≈ 3

(B-2-2) 4,4'-diphenylmethanebismaleimide (BMI-1000 by Daiwa Fine Chemicals Co., Ltd.)
(C) Inorganic Filler
(C-1) Molten spherical silica (RS-8225H/53C by TATSUMORI LTD.; average particle size 13 μm)
(D) Anionic Curing Accelerator
(D-1) Imidazole compound (1B2PZ by SHIKOKU CHEMICALS CORPORATION)
(E) Curing Agent
(E-1) Phenol novolac resin (TD-2131 by DIC Corporation; phenolic hydroxyl group equivalent 104)
(F) Mold Release Agent
(F-1) Carnauba wax (TOWAX-131 by TOA KASEI CO., LTD.)
(G) Coupling Agent
(G-1) 3-glycidoxypropyltrimethoxysilane (KBM-403 by Shin-Etsu Chemical Co., Ltd.)

Working Examples 1 to 6; Comparative Examples 1 to 6

Resin compositions were obtained by melting and mixing the components at the compounding ratios (parts by mass) shown in Table 1, and then performing cooling and crushing. The following properties of each composition were measured. The results thereof are shown in Table 1.

Glass-Transition Temperature

A mold manufactured in accordance with the EMMI standard was used to cure the above resin composition under a condition(s) of: molding temperature 175° C.; molding pressure 6.9 N/mm$^2$; molding period 180 sec. The cured composition was then subjected to post curing at 180° C. for four hours. The glass-transition temperature of a test piece prepared from the post-cured cured product was measured using TMA (TMA8310 by Rigaku Corporation).

A temperature rise program was set to a rate of 5° C./min, and a constant load applied to the test piece of the post-cured product was set to 49 mN. A change in the size of the test piece was then measured as the temperature rose from 25° C. to 300° C. The correlation between such change in size and the temperature was plotted on a graph. The glass-transition temperatures in the working and comparative examples were then obtained based on such graph depicting the correlation between the change in size and the temperature.

Elastic Modulus Under Heat

A mold manufactured in accordance with JIS K 6911:2006 was used to produce a cured product of the above resin composition under a condition(s) of: molding temperature 175° C.; molding pressure 6.9 N/mm²; molding period 180 sec. The cured product was then subjected to post curing at 200° C. for an hour.

A bending elastic modulus of a test piece prepared from the post-cured cured product was then measured at 260° C. in accordance with JIS K6911:2006.

Water Absorption Rate, Residual Water Absorption Rate (Moisture Discharge Rate)

A circular plate having a thickness of 3 mm and a diameter of 50 mm was molded under a condition(s) of: molding temperature 175° C.; molding pressure 6.9 N/mm²; molding period 180 sec. The cured product was then subjected to post curing at 200° C. for an hour. After further treating the cured product under a saturated water vapor of 121° C. and 2.1 atm for 24 hours, a weight increase rate was calculated based on weights observed before and after the treatment, and a water absorption rate was then able to be calculated based on such weight increase rate. Later, the cured product that had absorbed water was subjected to a heat treatment at 120° C. for 24 hours. A residual water absorption rate was then calculated based on a weight observed immediately after the post curing, and on a weight observed after the cured product had absorbed water and been further subjected to the heat treatment.

Weight Reduction Rate

A circular plate having a thickness of 3 mm and a diameter of 50 mm was molded under a condition(s) of: molding temperature 175° C.; molding pressure 6.9 N/mm²; molding period 180 sec. The cured product was then subjected to post curing at 200° C. for an hour. After further performing a heat treatment on such cured product at 250° C. for 48 hours, a weight reduction rate was then calculated based on weights observed before and after the heat treatment.

Moldability

A QFP (Quad Flat Package) (14 mm×20 mm×1.4 mm, 6 cavities) was molded under a condition(s) of: molding temperature 175° C.; molding pressure 6.9 N/mm²; molding period 180 sec. Here, it was confirmed whether cull and/or runner breakage had occurred. Particularly, examples exhibiting cull and/or runner breakage were given "0," whereas examples exhibiting no cull and/or runner breakage were given "x."

Reflow Resistance

A sample molded in a similar manner as that in the moldability evaluation was subjected to post curing at 200° C. for an hour. Later, there were prepared six samples by performing separation at lead parts. Each sample was dried at 125° C. for two hours, and then rendered to absorb water at 85° C./85% RH for 48 hours. Next, the sample was passed through an IR reflow furnace three times (maximum temperature 260° C., in-furnace transit time 10 sec), followed by using an ultrasonic flaw detector to observe whether peeling had occurred in the package. The number of the samples exhibiting peeling was then counted.

Adhesion Force Under Heat

A test piece was produced by performing molding on a frame substrate obtained by plating a 20 mm×20 mm copper frame with silver, under a condition(s) of: molding temperature 175° C.; molding pressure 6.9 N/mm²; molding period 180 sec. The test piece was further subjected to post curing at 200° C. for an hour, and an adhesion force at 260° C. was then measured using a universal bond tester (DAGE SERIES 4000 by Nordson Advanced Technology (Japan) K.K.), where each test piece was plucked at a rate of 0.2 mm/sec.

As shown in Table 1, it became clear that the composition of the present invention was useful for encapsulating semiconductors.

TABLE 1

| Composition Table (part by mass) | | | Working example | | | | | | Comparative example | | | | | |
|---|---|---|---|---|---|---|---|---|---|---|---|---|---|---|
| | | | 1 | 2 | 3 | 4 | 5 | 6 | 1 | 2 | 3 | 4 | 5 | 6 |
| (A) | Epoxy resin | A-1 | 80.0 | 80.0 | | | 45.0 | | 56.3 | 45.0 | 45.0 | | 100.0 | 5.0 |
| | | A-2 | | | 80.0 | 80.0 | | 53.4 | | | | | | |
| (B) | Cyclic imide group-containing organopoly-siloxane | B-1-1 | 20.0 | | 20.0 | | 20.0 | | | | | 100.0 | | 95.0 |
| | | B-1-2 | | 20.0 | | 20.0 | | 20.0 | | | | | | |
| | | B-2-1 | | | | | | | | 20.0 | | | | |
| | | B-2-2 | | | | | | | | | 20.0 | | | |
| (C) | Inorganic filler | C-1 | 450.0 | 450.0 | 450.0 | 450.0 | 450.0 | 450.0 | 450.0 | 450.0 | 450.0 | 450.0 | 450.0 | 450.0 |
| (D) | Anionic curing accelerator | D-1 | 1.5 | 1.5 | 1.5 | 1.5 | 1.5 | 1.5 | 1.5 | 1.5 | 1.5 | 1.5 | 1.5 | 1.5 |
| (E) | Curing agent | E-1 | | | | | 35.0 | 26.6 | 43.7 | 35.0 | 35.0 | | | |
| (F) | Mold release agent | F-1 | 2.0 | 2.0 | 2.0 | 2.0 | 2.0 | 2.0 | 2.0 | 2.0 | 2.0 | 2.0 | 2.0 | 2.0 |
| (G) | Coupling agent | G-1 | 1.5 | 1.5 | 1.5 | 1.5 | 1.5 | 1.5 | 1.5 | 1.5 | 1.5 | 1.5 | 1.5 | 1.5 |
| Evaluation results | Glass-transition temperature | °C. | 170 | 160 | 170 | 162 | 168 | 164 | 170 | 134 | 200 | 68 | 175 | 72 |
| | Elastic modulus under heat | GPa | 1.0 | 0.8 | 1.1 | 1.0 | 0.9 | 0.8 | 1.5 | 0.9 | 1.5 | 0.3 | 1.6 | 0.5 |
| | Water absorption rate | % | 0.30 | 0.26 | 0.29 | 0.23 | 0.32 | 0.30 | 0.49 | 0.30 | 0.35 | 0.25 | 0.82 | 0.30 |
| | Residual water absorption rate | % | 0.11 | 0.08 | 0.10 | 0.08 | 0.12 | 0.10 | 0.19 | 0.12 | 0.21 | 0.05 | 0.32 | 0.09 |
| | Weight reduction rate | % | 0.8 | 0.8 | 0.8 | 0.8 | 0.8 | 0.8 | 1.2 | 1.5 | 1.0 | 0.4 | 1.3 | 0.5 |

TABLE 1-continued

| Composition Table (part by mass) | Working example | | | | | | Comparative example | | | | | |
| --- | --- | --- | --- | --- | --- | --- | --- | --- | --- | --- | --- | --- |
| | 1 | 2 | 3 | 4 | 5 | 6 | 1 | 2 | 3 | 4 | 5 | 6 |
| Moldability | X | X | X | X | X | X | X | ◯ | X | ◯ | ◯ | X |
| Reflow resistance | 0/6 | 0/6 | 0/6 | 0/6 | 0/6 | 0/6 | 2/6 | 1/6 | 2/6 | 0/6 | 6/6 | 1/6 |
| Adhesion force MPa under heat | 5.2 | 4.6 | 5.1 | 4.3 | 4.6 | 4.3 | 2.6 | 3.4 | 3.5 | 4.8 | 2.2 | 3.0 |

What is claimed is:

1. A heat-curable resin composition for semiconductor encapsulation, comprising:
   (A) an epoxy resin being solid at 25° C.;
   (B) an organopolysiloxane having, in one molecule, at least one cyclic imide group and at least one siloxane bond;
   (C) an inorganic filler; and
   (D) an anionic curing accelerator;
   wherein the component (B) comprises at least (B-2) or comprises (B-1) and (B-2):
   (B-1) a cyclic imide group-containing organopolysiloxane represented by the following average composition formula (1)

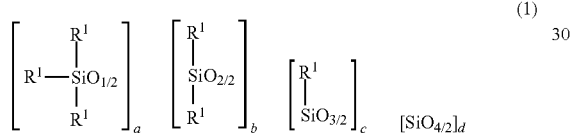

wherein $R^1$ independently represents a substituted or unsubstituted monovalent hydrocarbon group having 1 to 10 carbon atoms, or a group represented by the following general formula (2) or (3); at least one $R^1$ is a group represented by the following general formula (2) or (3); a represents an integer of not smaller than 2; b represents an integer of not smaller than 0; c represents an integer of not smaller than 0; d represents an integer of not smaller than 0; a, b, c and d satisfy $2 \leq a+b+c+d \leq 1{,}000$,

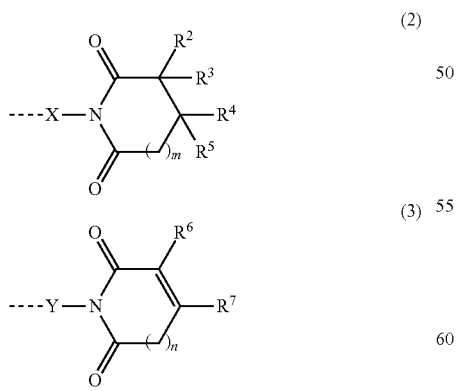

wherein each of $R^2$ to $R^7$ independently represents a hydrogen atom or a substituted or unsubstituted monovalent hydrocarbon group having 1 to 10 carbon atoms; $R^3$ and $R^4$ may bond together to form a ring; $R^6$ and $R^7$ may bond together to form a ring; each of m and n represents an integer of 0 to 3; each of X and Y represents a substituted or unsubstituted divalent hydrocarbon group that has 1 to 10 carbon atoms, and may have a hetero atom(s); broken lines represent connections to silicon atoms in the formula (1);

(B-2) a cyclic imide group-containing organopolysiloxane represented by the following average composition formula (1')

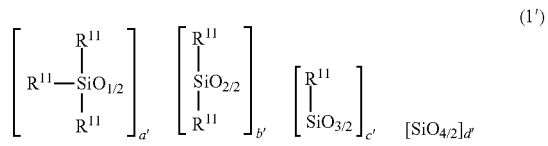

wherein $R^{11}$ independently represents a substituted or unsubstituted monovalent hydrocarbon group having 1 to 10 carbon atoms, or a group represented by the following general formula (2), (3) or (4); two $R^{11}$'s may bond together to form the structure represented by the following general formula (4);
at least one $R^{11}$ is a group represented by the following general formula (2), (3) or (4), and at least one $R^{11}$ is a group represented by the following general formula (4);
a' represents an integer of not smaller than 2; b' represents an integer of not smaller than 0; c' represents an integer of not smaller than 0; d' represents an integer of not smaller than 0; a', b', c' and d' satisfy $2 \leq a'+b'+c'+d' \leq 1{,}000$;

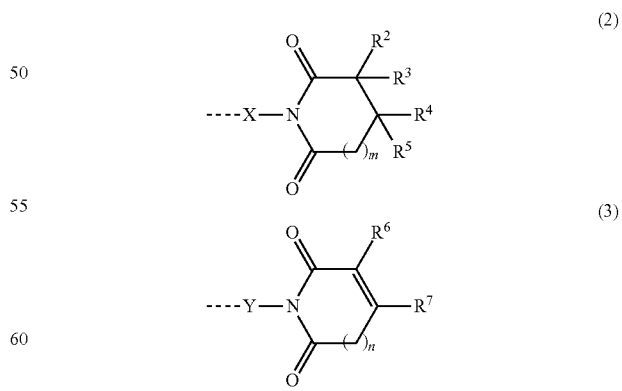

wherein each of $R^2$ to $R^7$ independently represents a hydrogen atom or a substituted or unsubstituted monovalent hydrocarbon group having 1 to 10 carbon atoms; $R^3$ and $R^4$ may bond together to form a ring; $R^6$ and $R^7$ may bond together to form a ring; each of m and n represents an integer of 0 to 3; each of X and Y represents a substituted or unsubstituted divalent hydrocarbon group that has 1 to 10 carbon atoms, and may have a hetero atom(s); broken lines represent connections to the silicon atoms in the formula (1'),

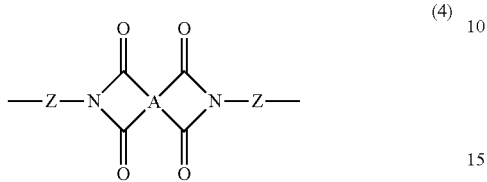

(4)

wherein Z represents a substituted or unsubstituted divalent hydrocarbon group that has 1 to 10 carbon atoms, and may have a hetero group(s); and wherein A in the general formula (4) has any one of the following structures

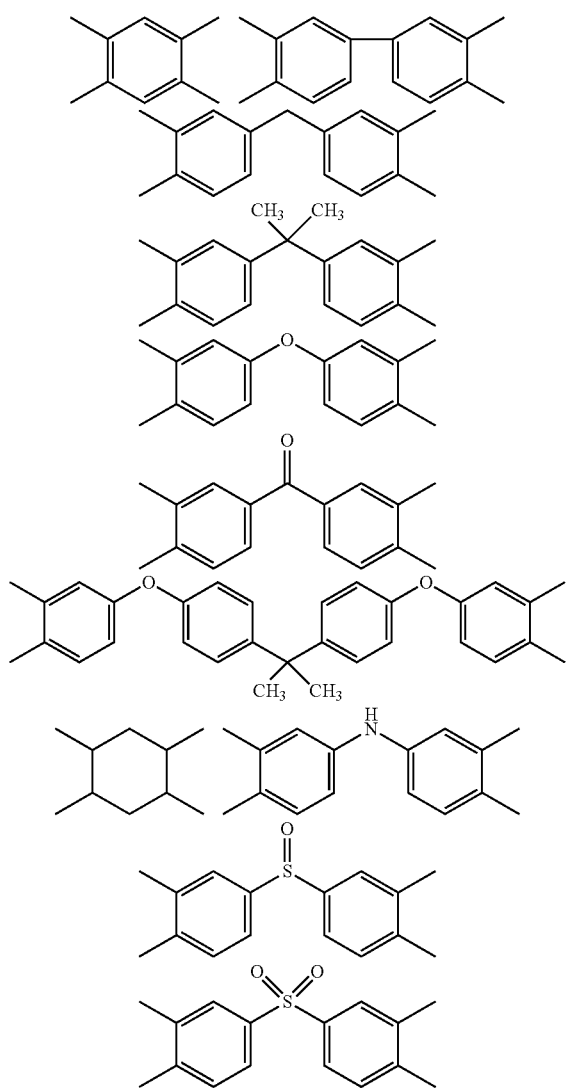

wherein bonds in the above structural formulae that are yet unbonded to substituent groups are to be bonded to carbonyl carbons forming cyclic imide structures in the general formula (4);

wherein at least one of $R^1$ groups and/or $R^{11}$ groups is an organic group having a maleimide structure represented by the following formula (3')

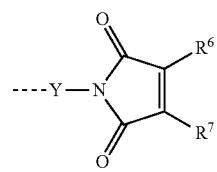

(3')

wherein each of $R^6$ and $R^7$ represents a hydrogen atom or a substituted or unsubstituted monovalent hydrocarbon group having 1 to 10 carbon atoms; $R^6$ and $R^7$ may bond together to form a ring; Y represents a substituted or unsubstituted divalent hydrocarbon group that has 1 to 10 carbon atoms, and may have a hetero atom(s); a broken line represents a connection to the silicon atoms in the formula (1) or (1'); and a ratio between the components (A) and (B) is in a range of (A):(B)=99:1 to 10:90.

2. The heat-curable resin composition for semiconductor encapsulation according to claim 1, further comprising a curing agent as a component (E).

3. The heat-curable resin composition for semiconductor encapsulation according to claim 2, wherein the curing agent as the component (E) is a phenol curing agent and/or a benzoxazine curing agent.

4. A semiconductor device encapsulated by a cured product of the heat-curable resin composition for semiconductor encapsulation according to claim 1.

5. The heat-curable resin composition for semiconductor encapsulation according to claim 1, wherein the component (B) comprises both (B-1) and (B-2).

6. The heat-curable resin composition for semiconductor encapsulation according to claim 1, wherein the component (B) comprises only (B-2).

7. The heat-curable resin composition for semiconductor encapsulation according to claim 1, wherein the cyclic imide group-containing organopolysiloxane (B-1) is a component represented by:

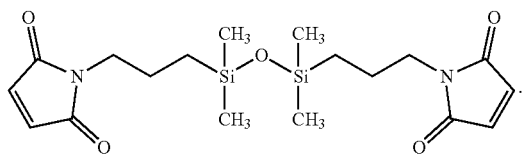 [SMILES: C[Si](C)(CCCN1C(=O)C=CC1=O)O[Si](C)(C)CCCN1C(=O)C=CC1=O]

8. The heat-curable resin composition for semiconductor encapsulation according to claim 1, wherein the cyclic imide group-containing organopolysiloxane (B-2) is a component represented by:

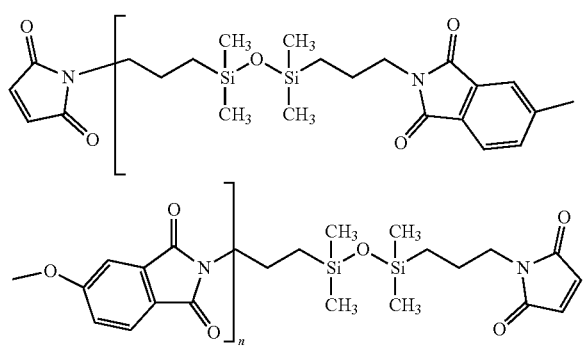

wherein n=3.

9. The heat-curable resin composition for semiconductor encapsulation according to claim 1, wherein the epoxy resin has a melting point of 40 to 150° C. or a softening point of 50 to 160° C.

10. The heat-curable resin composition for semiconductor encapsulation according to claim 1, wherein the epoxy resin is selected from the group consisting of a bisphenol A-type epoxy resin; a bisphenol F-type epoxy resin; a biphenol type epoxy resin; a phenol novolac-type epoxy resin; a cresol novolac-type epoxy resin; a bisphenol A novolac-type epoxy resin; a naphthalenediol-type epoxy resin; a trisphenylol methane-type epoxy resin; a tetrakisphenylol ethane-type epoxy resin; a phenol biphenyl-type epoxy resin; an epoxy resin prepared by hydrogenating the aromatic rings in a dicyclopentadiene-type epoxy resin; an epoxy resin prepared by hydrogenating the aromatic rings in a phenol dicyclopentadiene novolac-type epoxy resin; a triazine derivative epoxy resin; an alicyclic epoxy resin, and mixtures thereof.

11. The heat-curable resin composition for semiconductor encapsulation according to claim 1, wherein the epoxy resin is selected from the group consisting of a trisphenylol methane-type epoxy resin and a dicyclopentadiene-type epoxy resin.

12. The heat-curable resin composition for semiconductor encapsulation according to claim 1, wherein the epoxy resin is present in an amount of 10 to 40% by mass.

* * * * *